United States Patent [19]
Liao

[11] Patent Number: 6,130,011
[45] Date of Patent: Oct. 10, 2000

[54] METHOD OF FABRICATING IMPLANTATION MASK

[75] Inventor: Kuan-Yang Liao, Taipei, Taiwan

[73] Assignee: United Silicon Incorporated, Hsinchu, Taiwan

[21] Appl. No.: 09/136,553

[22] Filed: Aug. 19, 1998

[30] Foreign Application Priority Data

May 22, 1998 [TW] Taiwan ................................. 87107997

[51] Int. Cl.$^7$ ..................................................... G03C 5/00
[52] U.S. Cl. ............................ 430/5; 430/314; 430/315; 430/324
[58] Field of Search ................................ 430/5, 296, 314, 430/315, 942, 324

[56] References Cited

U.S. PATENT DOCUMENTS

| | | |
|---|---|---|
| 5,139,925 | 8/1992 | Hartney ..................................... 430/326 |
| 5,318,870 | 6/1994 | Hartney ..................................... 430/18 |
| 5,362,606 | 11/1994 | Hartney et al. .......................... 430/315 |
| 5,366,852 | 11/1994 | Pavelchek et al. ...................... 430/326 |
| 5,550,007 | 8/1996 | Taylor et al. ............................ 430/314 |
| 5,707,783 | 1/1998 | Stauffer et al. .......................... 430/313 |

*Primary Examiner*—Christopher G. Young
*Attorney, Agent, or Firm*—Thomas, Kayden, Horstmeyer & Risley

[57] ABSTRACT

A method of fabricating a deep UV implantation mask. A deep UV photo-resist layer is formed on a substrate. The deep UV photo-resist layer is defined to cover a part of the substrate. A silylation process is performed to transform the surface of the deep UV photo-resist layer into a hard mask layer. Using the hard mask layer as a mask, the substrate is implanted with ions.

11 Claims, 2 Drawing Sheets

METHOD OF FABRICATING IMPLANTATION MASK

CROSS-REFERENCE TO RELATED APPLICATION

This application claims the priority benefit of Taiwan application serial no. 87107997, filed May 22, 1998, the full disclosure of which is incorporated herein by reference.

BACKGROUND OF THE INVENTION

1. Field of the Invention

The invention relates in general to a method of fabricating an implantation mask, and more particularly, to a method of fabricating an implantation mask using deep ultra-violet (UV) photo-resist.

2. Description of the Related Art

In FIG. 1, a method of mask implantation is shown. On the substrate 10, a thick photo-resist layer 12 is formed. The photo-resist layer 12 covers a part of the substrate 10. A part of the substrate 10 to be implanted with ion is exposed. Using the photo-resist layer 12 as an implantation mask, the exposed substrate 10 is implanted with ions. Since the material structure of the photo-resist layer 12 is unconfined, to avoid the implanted ions to penetrate therethrough, a very thick photo-resist layer is required. This is more obvious while implantation ion has a very high implantation energy. Moreover, it is difficult to coat a photo-resist layer with a thickness of about 2.5 µm.

Under the condition of providing a plurality of photo-resist layers 22a, 22b, and 22c on a substrate 20 as shown in FIG. 2. Since the properties of these photo-resist layers 22a, 22b, and 22c are similar, so that a uniformity is obtained due to the mutual diffusion thereof. Therefore, while implanting the substrate with the photo-resist layers as masks, the implanted ions with a high implantation energy are very likely to penetrate through these photo-resist layers 22a, 22b, and 22c. In addition, the formation of multi-layers of photo-resist is very complex.

In FIG. 3, on a substrate 30, a sandwiched type photo-resist layer is formed. A photo-resist layer 32 is formed on the substrate 30. On the photo-resist layer 32, an ilayer 34. The photo-resist layer 32, the oxide layer 32, and the photo-resist layer 36 are stacked as a sandwiched type photo-resist layer. The photo-resist layer 36 is used to define the oxide layer 34, whereas the oxide layer 34 is a hard material to prevent ions to penetrate therethrough and implanted into the substrate 30 covered thereby. Though the formation of an oxide layer is advantageous to prevent ions to penetrate through, a high temperature is required during formation process, so that the compatibility between oxide and the photo-resist is poor. Therefore, a problem of integrity is caused during deposition of the photo-resist layer. Furthermore, the process for defining the oxide layer comprises a step of plasma etching which complicates the process of forming the sandwiched type photo-resist layer.

FIG. 4 shows the application of forming a well region of a twin-well structure within a substrate. On a substrate 40, a photo-resist layer 42 is formed and defined to cover a part of the substrate 40. The exposed part of the substrate 40 is doped by ion implantation with the photo-resist layer 42 as a mask. An annealing process is performed thereafter, so that the implanted ions are diffused and a well region 44 is formed. However, the diffusion range of the well region 40 formed by annealing is difficult to control. As the dimension of a device shrink, a well region with an outsize dimension affects the reliability of the devices seriously.

Another more advanced example of a well region formed by a conventional method is shown as FIG. 5. Considering the drawback of the well region formed by the above method, after the formation of a thick photo-resist layer 52 on a substrate 50, the exposed part of the substrate 50 is implanted with ion with higher energy. Therefore, the ions are implanted into a deeper region of the substrate 50. Consequently, an even diffusion is caused during annealing, an outsize range of a well region is avoided. However, as mentioned above, ions with a higher energy are very likely to penetrate through the photo-resist layer to dope a region which is predetermined as an undoped region or another well region doped with the opposite type of ions.

SUMMARY OF THE INVENTION

It is therefore an object of the invention to provide a method of fabricating a deep UV implantation mask. On a substrate, a deep UV photo-resist layer is formed. The deep UV photo-resist layer covers a part of the substrate. A process of silylation is performed to transform the surface of the deep UV photo-resist layer into a hard mask layer. Without a very large thickness, the hard mask effectively prevents ions to penetrate therethrough. In addition, since the hard mask and the deep UV photo-resist layer are formed in-situ, a very good compatibility therebetween is obtained.

To achieve these objects and advantages, and in accordance with the purpose of the invention, as embodied and broadly described herein, the invention is directed towards a method of fabricating a deep UV implantation mask. A deep UV photo-resist layer is formed on a substrate. The deep UV photo-resist layer is defined to cover a part of the substrate. A silylation process is performed to transform the surface of the deep UV photo-resist layer into a hard mask layer. Using the hard mask layer as a mask, the substrate is implanted with ions.

It is to be understood that both the foregoing general description and the following detailed description are exemplary and explanatory only and are not restrictive of the invention, as claimed.

DESCRIPTION OF THE PREFERRED EMBODIMENTS

Figure 1:
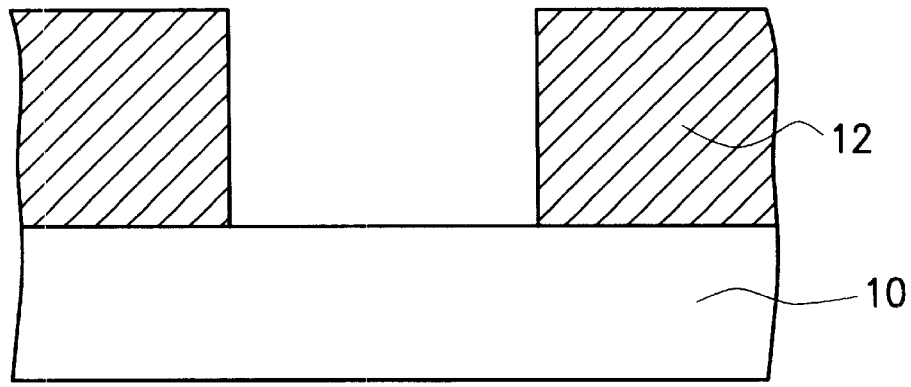
FIG. 1 is a cross sectional view, of which a conventional method of forming a implantation mask is shown.
Figure 2:
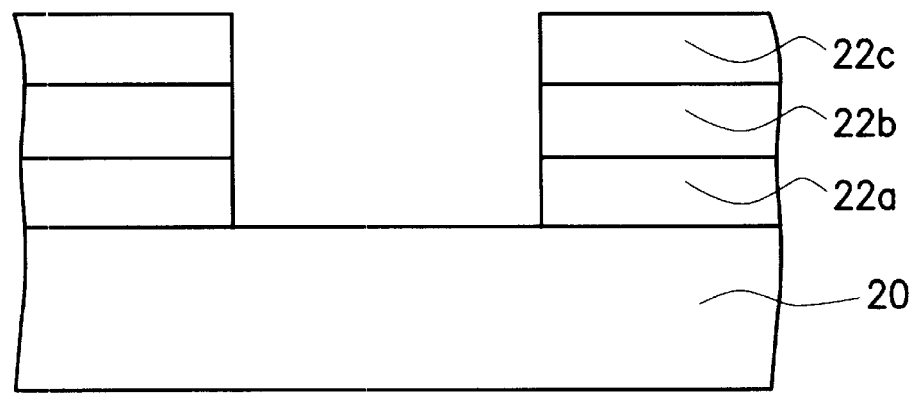
FIG. 2 is a cross sectional view, of which another conventional method of forming a implantation mask is shown.
Figure 3:
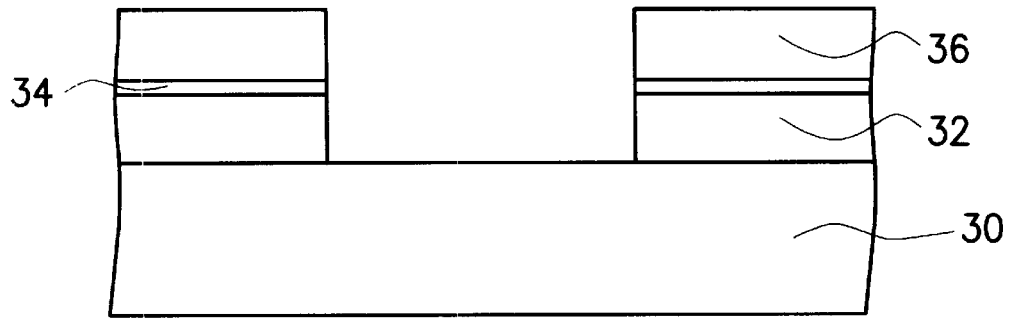
FIG. 3 is a cross sectional view, of which another conventional method of forming a implantation mask is shown.
Figure 4:
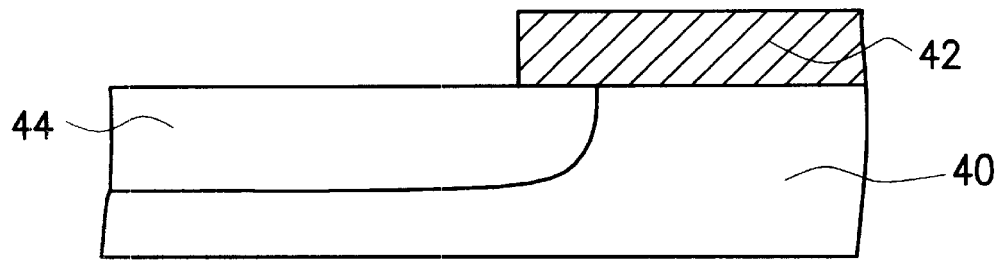
FIG. 4 shows a cross sectional view of a well region of a twin-well structure formed by a conventional method.
Figure 5:
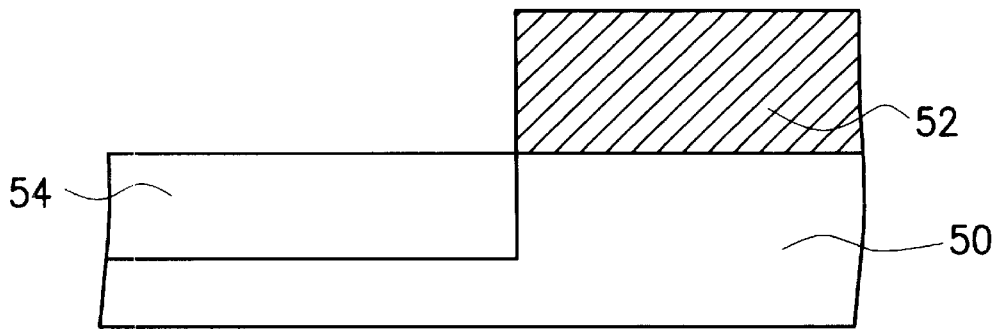
FIG. 5 shows a cross sectional view of a well region of a twin-well structure formed by another conventional method.
Figure 6A:
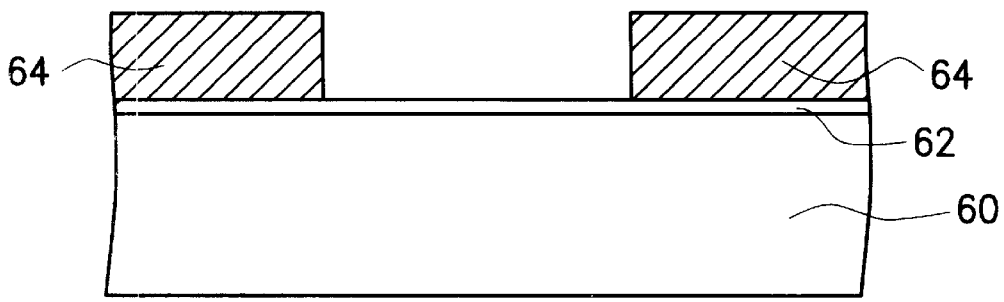
FIG. 6A to FIG. 6C are cross sectional views, of which a method of fabricating an implantation mask in a preferred embodiment according to the invention is shown.

In FIG. 6A, on a substrate 60, a sacrificial oxide layer 62 is formed to avoid a channeling effect which affects the preciseness of the depth of a well region in the subsequent process. A deep UV photo-resist layer 64 is formed on the sacrificial oxide layer 62. The deep UV photo-resist layer 64 is defined to expose a part of the sacrificial oxide layer 62.

Figure 6B:
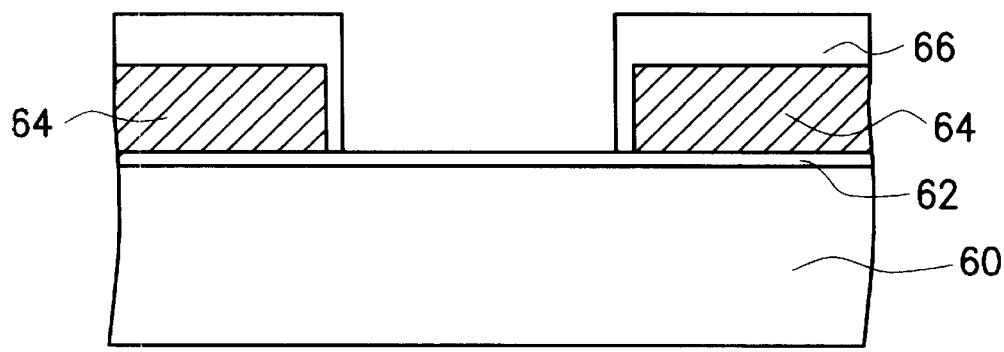
Figure 6C:
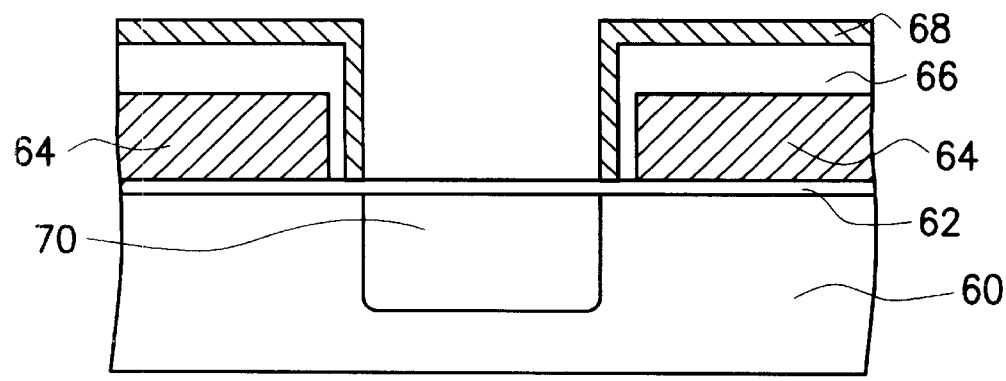

In FIG. 6B, a process of silylation is performed to transform a surface of the deep UV photo-resist layer 64 into a hard mask layer 66, for example, a silicon layer. The thickness of the hard mask layer 66 is determined by the implantation energy. Or optionally, a plasma treatment is performed to transform a surface of the hard mask layer 66 into a further harder mask layer 68, for example, a silicon nitride layer in an environment of nitrogen or a silicon oxide layer in an environment of oxygen.

Using the hard mask layer 66 and the harder mask layer 68 as masks, the substrate 60 is implanted with ions by a high implantation energy to form a well region 70. The high implantation energy is applied to avoid an outsize diffusion of the implanted ions. Since the material of the hard mask layer 66 and the harder mask layer 68 are dense enough, so that the implantation do not have enough energy to penetrate through though the hard mask layer 66 and the harder mask layer are not very thick. The hard mask layer 66 and the harder mask layer 68 are then removed after ion implantation.

The hard mask layer 66 and the harder mask layer 68 are formed from transforming the deep UV photo-resist layer, so that the problem of an incompatibility therebetween is not caused. Furthermore, the hard mask layer 66 and the harder mask layer 68 in an in-situ process, therefore, the ion implantation process is simplified.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating an implantation mask, comprising:

providing a substrate;

forming and defining a photo-resist layer on the substrate to form a defined photo-resist layer, wherein a part of the substrate is exposed by the defined photo-resist layer; and performing a process of silylation on the defined photo-resist layer to transform a surface region of the defined photo-resist layer into a first hard mask layer.

2. The method according to claim 1, wherein the photo-resist layer includes a deep UV photo-resist layer.

3. The method according to claim 1, wherein the substrate comprise a sacrificial oxide layer on top.

4. The method according to claim 1, wherein the first hard mask layer comprises a silicon layer.

5. The method according to claim 1, wherein after performing the process of silylation, a plasma treatment is further performed, so that a second hard mask layer is formed from further transforming a surface of the first hard mask layer.

6. The method according to claim 5, wherein the second hard mask layer comprises a silicon nitride layer.

7. The method according to claim 5, wherein the second hard mask layer comprises a silicon oxide layer.

8. A method of fabricating an implantation mask, comprising:

providing a substrate;

forming a defined photo-resist layer on the substrate, wherein a part of the substrate is exposed by the defined photo-resist layer;

performing a process of silylation on the photo-resist layer to transform a surface portion of the defined photo-resist layer into a first hard mask layer; and optionally performing a plasma treatment to farther transform a surface portion of the first mask layer to a second mask layer.

9. A method of forming a well, comprising:

providing a substrate;

forming a defined photo-resist layer on the substrate, wherein the defined photo-resist layer exposes a part of the substrate;

performing a silylation process on the defined photo-resist layer to transform a surface region of the defined photo-resist layer into a hard mask layer; and implanting ions into the substrate, using the hard mask layer as a mask.

10. The method according to claim 9, wherein the photo-resist layer includes a deep UV photo-resist layer.

11. The method according to claim 9, wherein the method further comprises performing a plasma treatment on the hard mask layer, so as to form an additional mask layer on a surface region of the hard mask.

* * * * *